US011128300B1

(12) United States Patent
Hanagami et al.

(10) Patent No.: US 11,128,300 B1
(45) Date of Patent: Sep. 21, 2021

(54) LEVEL SHIFTER CIRCUIT WITH INTERMEDIATE POWER DOMAIN

(71) Applicant: Apple Inc., Cupertino, CA (US)

(72) Inventors: Nathan F. Hanagami, San Francisco, CA (US); Hao Zhou, San Jose, CA (US); Jianbao Wang, Tucson, AZ (US); Ruopeng Wang, San Jose, CA (US); Ludmil N. Nikolov, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/820,659

(22) Filed: Mar. 16, 2020

(51) Int. Cl.
*H03L 5/00* (2006.01)
*H03K 19/0185* (2006.01)
*H03K 19/003* (2006.01)
*H03K 19/017* (2006.01)
*H03K 19/21* (2006.01)
*H03K 19/173* (2006.01)

(52) U.S. Cl.
CPC ........... *H03K 19/018521* (2013.01); *H03K 19/00384* (2013.01); *H03K 19/01721* (2013.01); *H03K 19/1737* (2013.01); *H03K 19/215* (2013.01)

(58) Field of Classification Search
CPC ..... H03K 19/018521; H03K 3/356113; H03K 19/00315; H03K 17/102; H03K 3/012
USPC .......................... 327/333; 326/63, 68, 80, 81
See application file for complete search history.

(56) References Cited

U.S. PATENT DOCUMENTS

| | | | |
|---|---|---|---|
| 6,124,749 A * | 9/2000 | Morishima | H03K 19/0019 327/390 |
| 7,368,946 B1 | 5/2008 | Rahman et al. | |
| 7,400,171 B1 * | 7/2008 | Montazer | H03K 3/356113 326/68 |
| 7,489,178 B2 | 2/2009 | Yeung | |
| 7,548,092 B2 * | 6/2009 | Lablans | H03K 19/20 326/104 |
| 7,999,574 B2 | 8/2011 | Takenaka | |
| 8,339,177 B2 | 12/2012 | Jarrar et al. | |
| 2010/0231259 A1 * | 9/2010 | Jung | H03K 19/018521 326/81 |
| 2016/0308355 A1 * | 10/2016 | Price | H03K 5/2481 |

* cited by examiner

*Primary Examiner* — Quan Tra
(74) *Attorney, Agent, or Firm* — Kowert, Hood, Munyon, Rankin & Goetzel, P.C.; Erik A. Heter

(57) ABSTRACT

A level shifter circuit with an intermediate power domain and method for operating the same is disclosed. The level shifter circuit includes an input circuit, an output circuit, and an intermediate circuit. The input circuit is coupled to receive an input signal from a first voltage domain operating according to a first supply voltage, and generates a first intermediate signal. The intermediate circuit receives the first intermediate signal and generates a second intermediate signal. The output circuit receives the intermediate signal and provides an output signal into a second voltage domain operating at a second supply voltage different from the first. A voltage multiplexer is configured to provide one of the first or second supply voltages to the intermediate circuit depending on a state of the input signal.

20 Claims, 6 Drawing Sheets

LEVEL SHIFTER CIRCUIT WITH INTERMEDIATE POWER DOMAIN

BACKGROUND

Technical Field

This disclosure is directed to electronic circuits, and more particularly, to circuits used to transfer signals from one voltage domain to another.

Description of the Related Art

In integrated circuits (ICs), difference circuitry implemented thereon may operate based on different supply voltages. For example, input/output (I/O) circuits that interface an IC to the external world may operate on a supply voltage that that is greater than that of internal processing circuitry. Despite the fact that these circuits operate on different supply voltages, it is often times necessary for these circuits to communicate with one another. Accordingly, level shifters may be provided to facilitate the transfer of signals from one voltage domain to another.

A level shifter is a circuit that translates signal from one voltage domain to another. For example, a level shifter may receive a signal from a first circuit operating at a supply voltage of 1.1 volts, and may output a signal to a second circuit operating at a supply voltage of 0.8 volts. A level shifter may transfer signals from a domain operating according to a lower supply voltage to a higher supply voltage, and vice versa.

SUMMARY

A level shifter circuit with an intermediate power domain and method for operating the same is disclosed. In one embodiment, a level shifter circuit includes an input circuit, an output circuit, and an intermediate circuit. The input circuit is coupled to receive an input signal from a first voltage domain operating according to a first supply voltage, and generates a first intermediate signal. The intermediate circuit receives the first intermediate signal and generates a second intermediate signal. The output circuit receives the intermediate signal and provides an output signal into a second voltage domain operating at a second supply voltage different from the first. A voltage multiplexer is configured to provide one of the first or second supply voltages to the intermediate circuit depending on a state of the input signal.

In one embodiment, the voltage multiplexer is configured to provide the first supply voltage to the intermediate circuit when the input signal is received in a first logical state. When the input signal is received in a second logical state, the voltage multiplexer is configured to provide the second supply voltage to the intermediate circuit. In various embodiments, the input stage, the output stage, and the intermediate stage are each configured such that no current is consumed when they are in a quiescent state.

BRIEF DESCRIPTION OF THE DRAWINGS

The following detailed description makes reference to the accompanying drawings, which are now briefly described.

Figure 1:
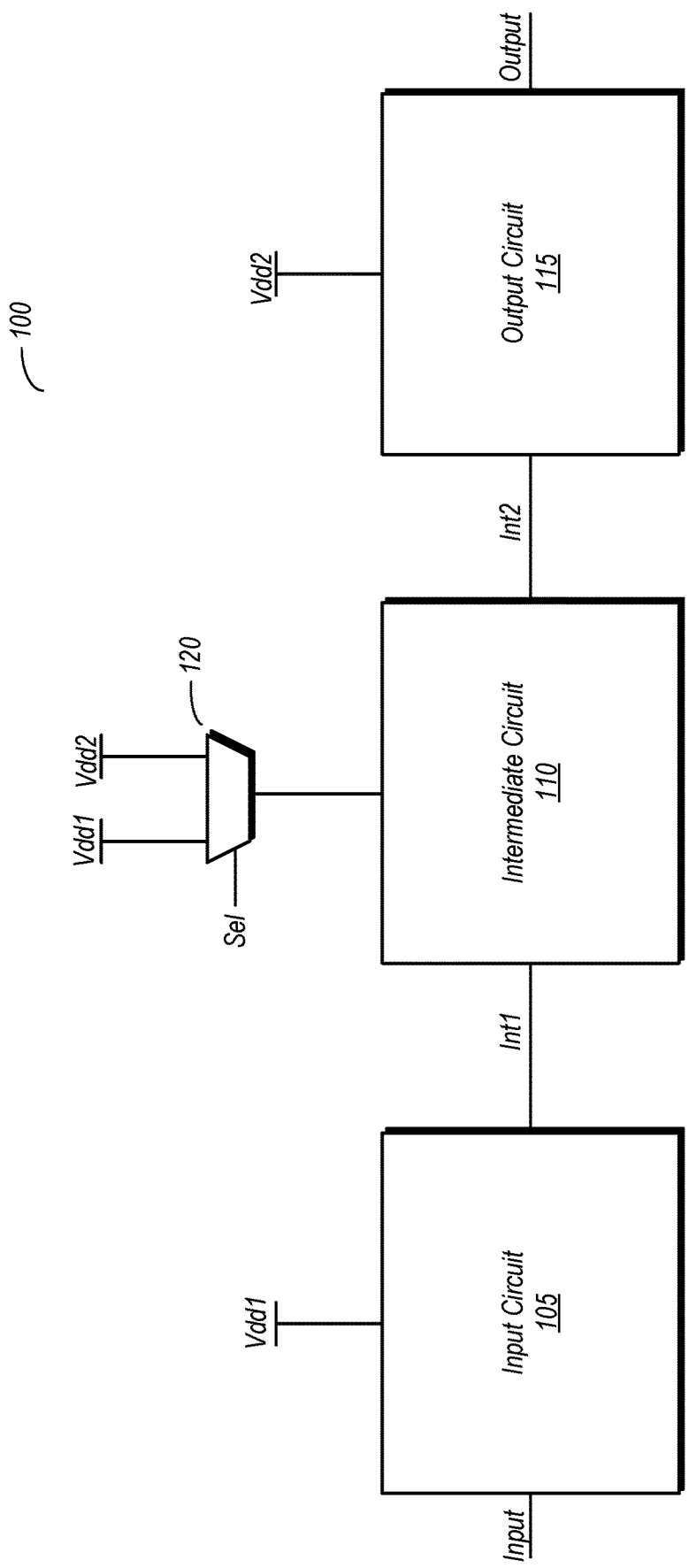
FIG. 1 is block diagram of one embodiment of a level shifter circuit.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

The present disclosure is directed to a level shifter circuit that includes an intermediate power domain. Level shifters are used in integrated circuits to transfer signals between circuit domains having different operating voltages. To transfer a signal from one domain to another, both domains should have valid (stable) supply voltages. When both domains are valid, a signal in a first domain can be transferred and level shifted into a second domain.

The level shifter of the present disclosure does not require a valid input domain (e.g., the domain from which the input signal is provided to the level shifter). Furthermore, the level shifter of the present disclosure has a zero steady-state quiescent current and does not depend on transient characteristics, as opposed to previous level shifters. As discussed below, the level shifter disclosed herein includes an input circuit (in a first voltage domain), and output circuit (in a second voltage domain), and an intermediate circuit coupled between the input and output circuits. The intermediate circuit may receive a supply voltage from either the first voltage domain or the second voltage domain depending on the state of the input signals. Various embodiments of such a level shifter are now discussed in further detail below.

Turning now to FIG. 1, a block diagram of one embodiment of a level shifter circuit is shown. In the embodiment shown, level shifter 100 includes an input circuit 105, an intermediate circuit 110, and an output circuit 115. Input circuit 105 in the embodiment shown is coupled to receive a first supply voltage, Vdd1. Output circuit 115 in the embodiment shown is coupled to receive a second supply voltage, Vdd2, which is different from the first. In various embodiments, Vdd2 may be less than Vdd1 or may be greater than Vdd1.

Input circuit 105 in the embodiment shown may receive an input signal, Input and outputs a first intermediate signal, Int1. Intermediate circuit 110 is coupled to receive the first intermediate signal, and outputs a second intermediate signal, Int2. Output circuit 115 receives the second intermediate signal and provide an output signal, Output, to circuitry in the voltage domain of Vdd2.

Intermediate circuit 110 in the embodiment shown may receive one of either the first supply voltage, Vdd1, or the second supply voltage, Vdd2. The supply voltage to the intermediate circuit 110 may pass through a voltage multiplexer 120, which includes respective inputs coupled to receive Vdd1 and Vdd2. In the illustrated example, a select signal is provided to voltage multiplexer 120 to select one of the first or second supply voltages to be provided to intermediate circuit 110. This select signal may actually comprise multiple signals. Furthermore, as is discussed below, the supply voltage selected by voltage multiplexer 120 may depend on a state of the input signal received by input circuit 105.

Figure 2:
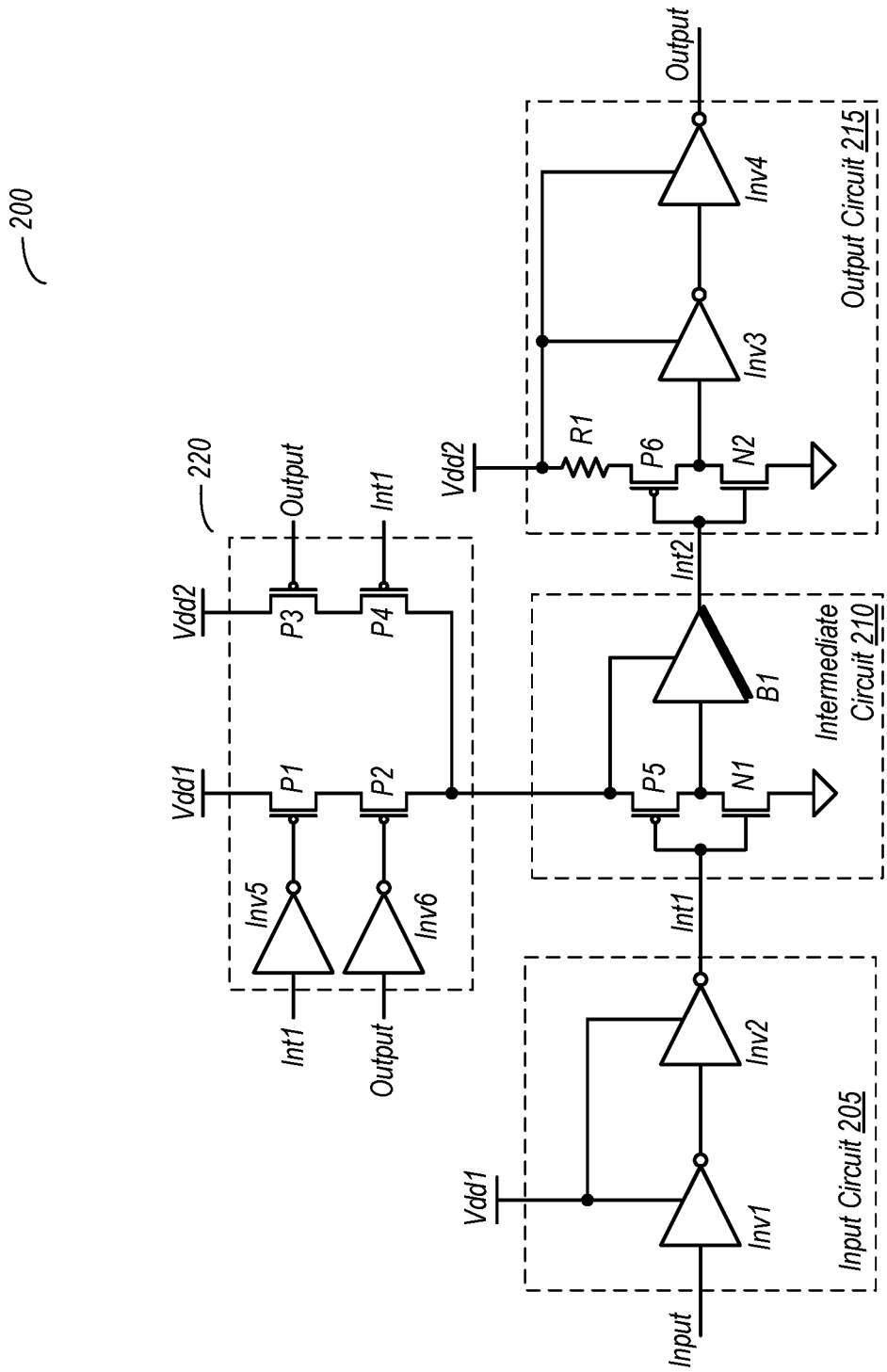
FIG. 2 is a schematic diagram of one embodiment of a level shifter circuit.

FIG. 2 is a schematic diagram of one embodiment of a level shifter circuit. In the embodiment shown, level shifter 200 includes the same basic components as level shifter 100 of FIG. 1, namely an input circuit 205, an intermediate circuit 210, an output circuit 215, and a voltage multiplexer 220. FIG. 2 illustrates additional details with regard to one particular embodiment of the level shifter circuit disclosed herein.

Input circuit 205 in the embodiment shown includes first and second inverters, Inv1 and Inv2, coupled in series with one another. Both of these inverters are coupled to receive the supply voltage Vdd1. The input signal (Input) to level shifter 200 is provided to the input of Inv1, and may be received from circuitry in a first voltage domain that is powered by Vdd1. Inverter Inv2 provides as an output a first intermediate signal, Int1, that is logically equivalent to the input signal.

Intermediate circuit 210 is coupled to receive the first intermediate signals on the input of an inverter that includes transistors P5 and N1. The output of this inverter is provided to a non-inverting buffer, B1, which in turn outputs a second intermediate signal, Int2. The second intermediate signals is provided at a logical state that is opposite that of the input signal. For example, if the input signal is provided as a logic high (e.g., logic 1), the second intermediate signal is provided as a logic low (e.g., logic 0). Both the inverter and buffer of intermediate circuit 210 may receive a supply voltage from voltage multiplexer 120, the operation of which is discussed in further detail below.

Output circuit 215 in the embodiment shown includes three inverters coupled in series. A first of these inverters includes transistors P5 and N2 which have respective gate terminals coupled to receive the intermediate signal. This first inverter of output circuit 215 is coupled to receive the supply voltage Vdd2 via a pull-up resistor R1. Resistor R1 in the embodiment shown may limit the transient current in the time between the transition of Int2 high and the changing of state of voltage multiplexer 220. Inverters Inv3 and Inv4 are each coupled to directly receive the supply voltage Vdd2. The output of the final inverter, Inv4, provides the output signal, Output, into the second voltage domain that includes circuitry powered based on Vdd2. The output signal is provided by output circuit 215 in a logical state equivalent to that of the input signal.

Voltage multiplexer 120 in the embodiment shown may provide one of the supply voltages, Vdd1 or Vdd2, to the intermediate circuit 210. The particular supply voltage provided to intermediate circuit 210 in this embodiment effectively depends on the logical state of the input signal. As shown here, voltage multiplexer 120 includes two pull-up stacks. A first of these pull-up stacks includes transistors P1 and P2, while a second pull-up stack includes transistors P3 and P4. The gate terminals of P1 and P2 are coupled to corresponding outputs of inverters Inv5 and Inv6, respectively.

When the input signal is provided as a logic 1, Int1 is correspondingly produced as a logic 1. As a result, inverter Inv5 outputs a low to the gate terminal of transistor P1, thereby activating that device. Similarly, an input signal provided as a logic 1 results in an output signal that is also produced as a logic 1, causing inverter Inv6 to output a to the gate terminal of transistor P2. Accordingly, at this point, P1 and P2 are active, while the highs on the respective gate terminals of P3 and P4 causes those devices to be inactive. Accordingly, with P1 and P2 active, the intermediate circuit 210 receives the supply voltage Vdd1.

A logic 0 provided as the input signal results in the first intermediate signal, Int1, being a low. Similarly, the output signal will also be provided as a low in this case. This causes activation of both P3 and P4, while P1 and P2 are held inactive. Accordingly, in this scenario, the intermediate circuit 210 receives Vdd2 as its supply voltage.

Figure 3:
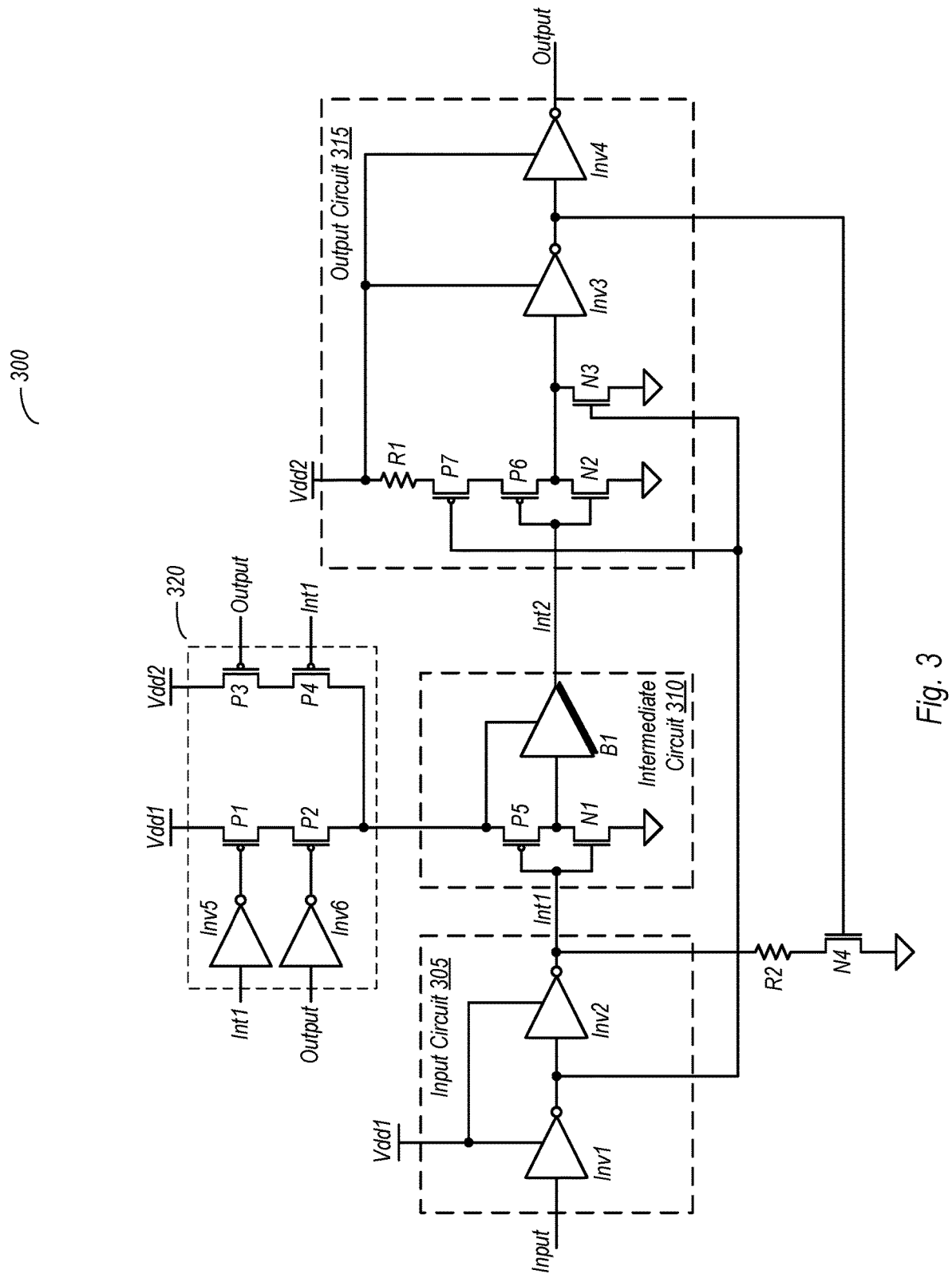
FIG. 3 is a schematic diagram of another embodiment of a level shifter circuit.

FIG. 3 is a schematic diagram of another embodiment of a level shifter circuit. Level shifter 300 in this embodiment includes some similarities to level shifter 200 shown in FIG. 2. In particular, the input circuit 305 and intermediate circuit 310 are arranged similarly to their respective counterparts in FIG. 2. The voltage multiplexer 320 shown in FIG. 3 is similarly arranged as the embodiment shown in FIG. 2. However, output circuit 315 in level shifter 300 includes some important differences with respect to its counterpart as shown in FIG. 2.

Output circuit 315 in this embodiment replaces one of the inverters with a NOR gate. The NOR gate in this example includes transistors P6, P7, N2, and N3. A resistor R1 is coupled between the source terminal of P7 and the supply voltage node Vdd2. Transistors P6 and N2 are coupled to receive the second intermediate signal, Int2, on their respective gate terminals. Transistor P7 and N3 are coupled to receive a signal from a feed forward circuit on their respective gate terminals, as will be discussed below.

In the embodiment shown, a feedback circuit and a feed forward circuit are coupled between output circuit 315 and input circuit 305. The feedback circuit in this embodiment is coupled between Inv3 and Inv4 of output circuit 315 and the output of Inv2 in input circuit 305. The feedback circuit includes a transistor N4 and a pull-down resistor R2. The gate of N4 is coupled to the output of Inv3, while the pull-down resistor is coupled between the output of Inv2 and a drain terminal of N4. When the output of Inv3 is high (corresponding to an input signal that is a low), transistor N4 is activated, and thus adding an additional pull-down to the first intermediate signal, Int1. Accordingly, the resistive pull-down on the output of Inv2 effectively latches that node low, even if Vdd1 is in a high impedance state. This in turn aids in turning on transistor P4 in voltage multiplexer 120.

In one embodiment, the combined drive strength of N4 and R2 is less than that of Inv2 when Vdd1 is in a valid state to alleviate potential conflicts between the two.

The feed forward circuit in the embodiment shown is coupled between the output of Inv1 and output circuit 315. In particular, the output signal from Inv1 is provided to respective gate terminals of P7 and N3. During operation, the state of the output signal provided by Inv1 and the second intermediate signal are typically in the same state. Accordingly, when the output of Inv1 and second intermediate signal Int2 are both logic high, N2 and N3 are activated, and the input to Inv3 is pulled low. When the output of Inv1 and the second intermediate signal Int2 are high, both P6 and P7 are activated and the input to Inv3 are pulled high. By utilizing a NOR gate as an inverting circuit in output circuit 315, along with the feed forward circuit, a temporary ring oscillator effect may be eliminated. In the absence of these elements, the temporary ring oscillator may be caused when the output of voltage multiplexer 320 is not valid. This temporary ring oscillator, if present, would exist from the intermediate supply voltage, through P5, B1, and to the output of the circuit, and would not be resolved until the intermediate supply voltage is valid. In the embodiment shown, however, the feed forward circuit causes activation of transistor N3 when a low is provided as an input to level shifter 300. This in turn places a low on the input of Inv3, with the result being a high on the output of Inv3/input of Inv4, and a corresponding low on the output of the circuit/ output of Inv4. Furthermore, the high on the output of Inv3 causes activation of N4, thereby causing Int1 to be pulled low. Thus, the circuit does not oscillate while waiting for the output of voltage multiplexer 320 to become valid.

The various embodiments of a level shifter discussed above (and more generally falling within the scope of this disclosure) may provide a number of advantages relative to other level shifter circuits. In embodiments such as that shown in FIG. 3, the level shifting operation may be performed even if Vdd1 is not currently valid (e.g., not stable during a power up phase of operation). This operation may be aided in at least some cases by the presence of the feedback circuit, which may pull down Int1 and therefore contribute to the activation of P4 in the pull-up stack that couples Vdd2 to the intermediate circuit. Another feature of the various level shifter embodiments disclosed herein is the non-reliance on transient characteristics. Furthermore, various embodiments of the level shifter circuit disclosed herein may effectively consume zero quiescent current, instead only consuming current during the actual switching of devices.

Figure 4:
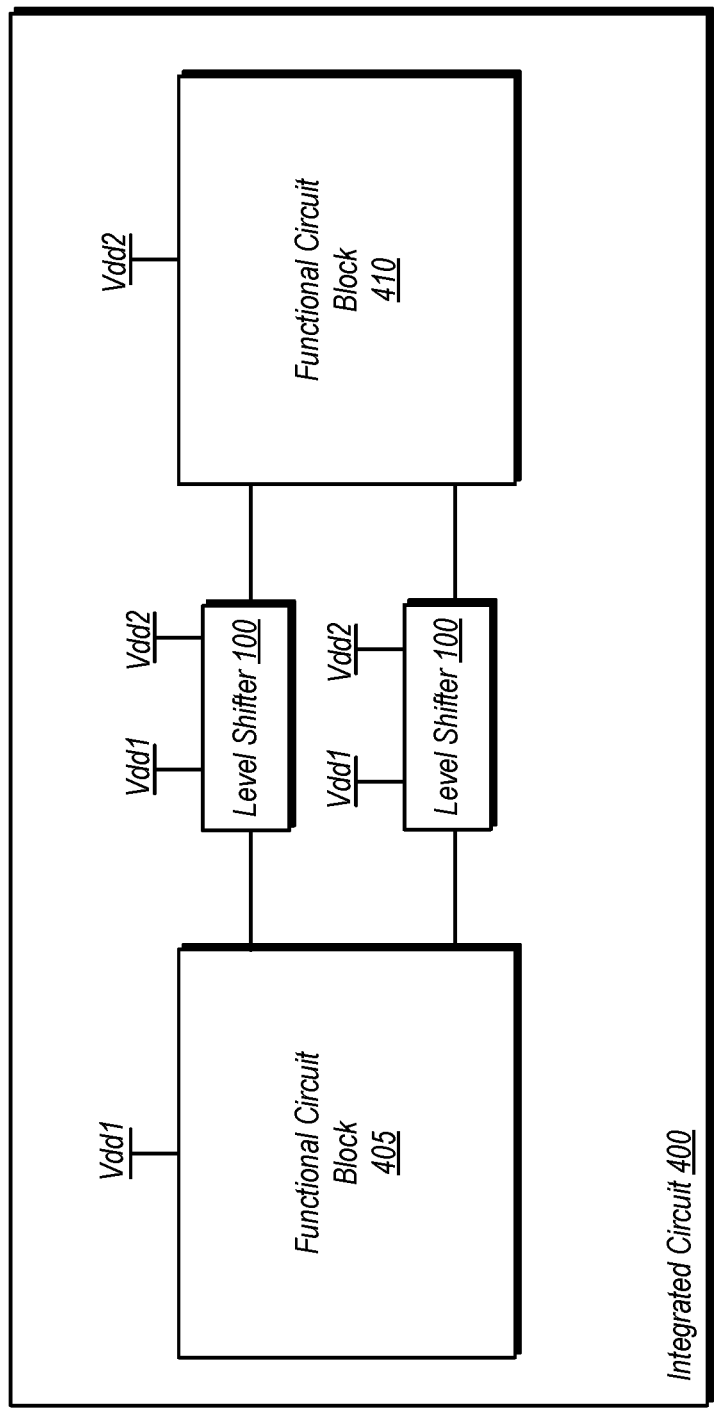
FIG. 4 is block diagram of one embodiment of an integrated circuit.

FIG. 4 is block diagram of one embodiment of an integrated circuit. In the embodiment shown, integrated circuit 400 includes functional circuit blocks 405 and 410. Functional circuit block 405 is in a first voltage domain, and is coupled to receive a first supply voltage Vdd1. Functional circuit block 410 is in a second voltage domain and is coupled to receive a second supply voltage Vdd2, which is different from Vdd 1 (and may be greater or lesser in value). These two units may transfer signals between one another using a number of level shifters. In this particular example, two level shifters 100 are shown, which may fall within the scope of any of the level shifter circuits disclosed herein. In particular, the level shifters 100 shown in FIG. 4 each include an input circuit, an intermediate circuit, and an output circuit. The intermediate circuit may be coupled to receive one of the supply voltages Vdd1 or Vdd2 dependent upon a state of the input signal.

Figure 5:
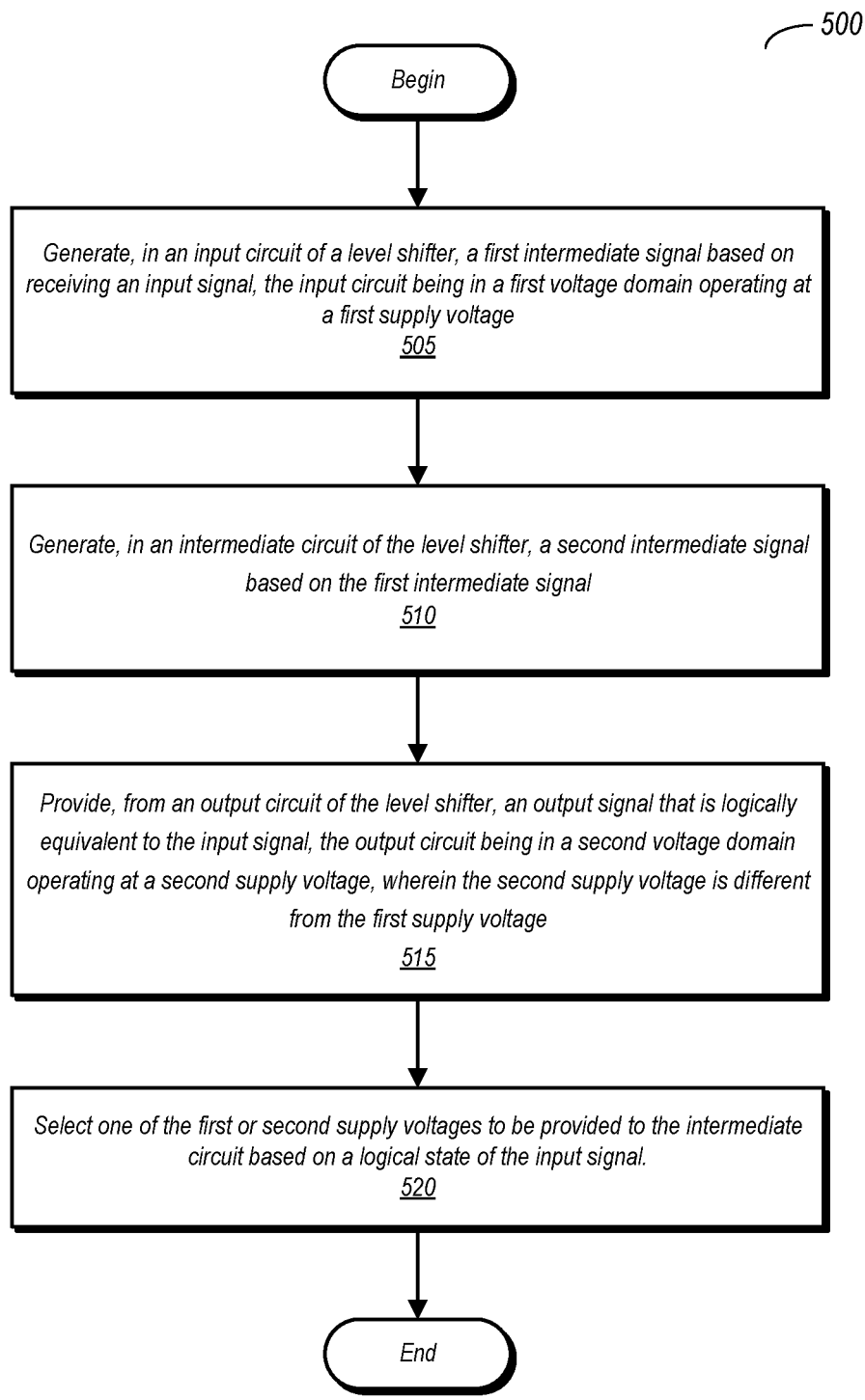
FIG. 5 is flow diagram illustrating one embodiment of a method for operating a level shifter circuit.

FIG. 5 is a flow diagram illustrating one embodiment of a method for operating a level shifter circuit. Method 500 in the embodiment shown may be performed with various ones of the embodiments of the level shifter circuit discussed above. Embodiments of a level shifter circuit capable of carrying out Method 500 but not explicitly discussed herein are also possible and contemplated, and may thus fall within the scope of this disclosure.

Method 500 includes generating, in an input circuit of a level shifter, a first intermediate signal based on receiving an input signal, the input circuit being in a first voltage domain operating at a first supply voltage (block 505). Method 500 further includes generating, in an intermediate circuit of the level shifter, a second intermediate signal based on the first intermediate signal (block 510). Thereafter, the method includes providing, from an output circuit of the level shifter, an output signal that is logically equivalent to the input signal, the output circuit being in a second voltage domain operating at a second supply voltage, wherein the second supply voltage is different from the first supply voltage (block 515). With regard to the intermediate circuit supply voltage, the method includes selecting one of the first or second supply voltages to be provided to the intermediate circuit based on a logical state of the input signal (block 520).

In various embodiments, the method includes providing the first intermediate signal in the logical state equivalent to the input signal, and providing the second intermediate signal in a logic state complementary to the intermediate signal. The method may also include latching the first intermediate signal when the second supply voltage is selected to be provided to the intermediate circuit, wherein the latching is performed by a feedback circuit coupled between the output circuit and the input circuit. Various embodiments may also include the level shifter, in a quiescent state, consuming zero current. In some embodiments, the method includes providing, via a feed forward circuit, a complement of the input signal to a first input of a NOR gate in the output circuit and further comprising providing the second intermediate signal to a second input of the NOR gate.

Figure 6:
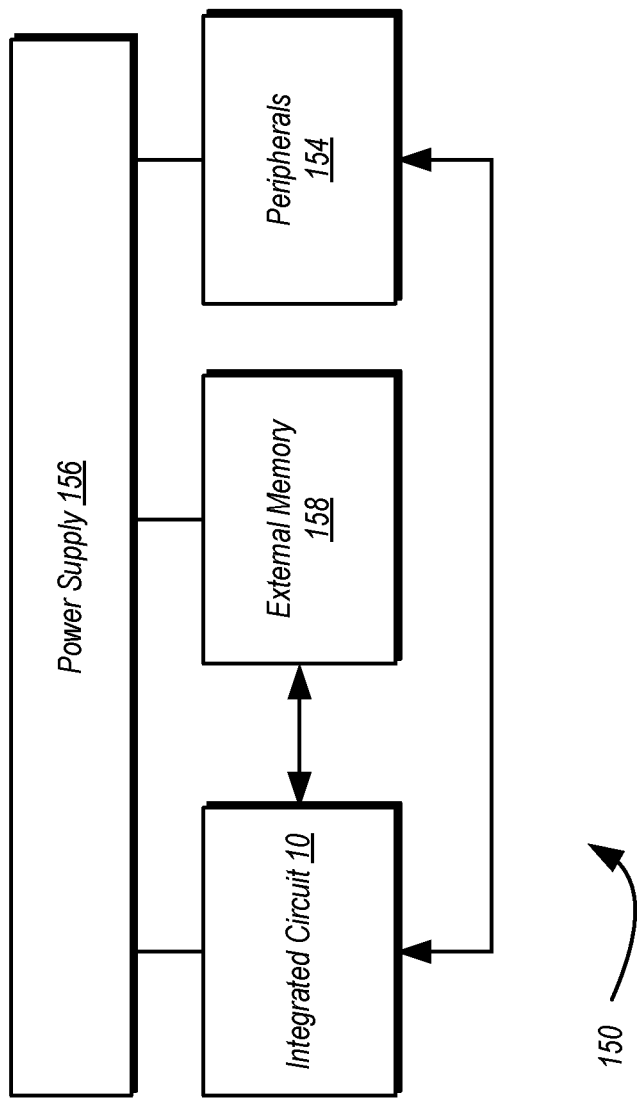
FIG. 6 is block diagram of one embodiment of an example system.

Turning next to FIG. 6, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

In various embodiments, IC 10, peripherals 154 and/or memory 158 may include one or more instances of a level shifter circuit as discussed above. Such instances of a level shifter may be used to transfer signals from one voltage domain to another voltage domain in IC 10.

Numerous variations and modifications will become apparent to those skilled in the art once the above disclosure is fully appreciated. It is intended that the following claims be interpreted to embrace all such variations and modifications.

What is claimed is:

1. A circuit comprising:
    an input circuit configured to receive an input signal from a first voltage domain operating at a first supply voltage, wherein the input signal is configured to generate a first intermediate signal, wherein the input circuit includes first and second inverting circuits coupled in series;
    an output circuit configured to provide an output signal into a second voltage domain operating at a second supply voltage different from the first supply voltage, wherein the output signal is logically equivalent to the input signal, wherein the output circuit includes third, fourth, and fifth inverting circuits coupled in series;
    an intermediate circuit coupled to receive the first intermediate signal and configured to provide a second intermediate signal to the output circuit based on the first intermediate signal;
    a voltage multiplexer configured to provide the first supply voltage to the intermediate circuit when the input signal is received in a first logical state, and further configured to provide the second supply voltage to the intermediate circuit when the input signal is received in a second logical state; and
    a feedback circuit coupled between an output of the fifth inverting circuit and an output of the second inverting circuit, wherein the feedback circuit is configured to latch a state of the first intermediate signal when the second supply voltage is selected by the voltage multiplexer.

2. The circuit of claim 1, wherein the input circuit is configured to provide the first intermediate signal in a logical state equivalent to the input signal.

3. The circuit of claim 1, wherein the intermediate circuit is configured to provide the second intermediate signal in a logically complementary state with respect to the first intermediate signal.

4. The circuit of claim 1, wherein the output circuit is configured to provide the output signal in a logically complementary state with respect to the second intermediate signal.

5. The circuit of claim 1, wherein the third inverting circuit is a NOR gate.

6. The circuit of claim 5, wherein the NOR gate is coupled to receive the second intermediate signal and, via a feed forward circuit, a signal output by the first inverter, wherein the second intermediate signal and the signal output by the first inverter are logically equivalent.

7. The circuit of claim 1, wherein the intermediate circuit includes a sixth inverting circuit and a buffer coupled in series, wherein the sixth inverting circuit is coupled to receive the first intermediate signal from the second inverter, and wherein the buffer is configured to provide the second intermediate signal to the third inverting circuit.

8. The circuit of claim 1, wherein the input circuit, output circuit, and intermediate stage are each configured to consume zero current when in a quiescent state.

9. A method comprising:
generating, in an input circuit of a level shifter, a first intermediate signal based on receiving an input signal, the input circuit being in a first voltage domain operating at a first supply voltage;
generating, in an intermediate circuit of the level shifter, a second intermediate signal based on the first intermediate signal;
providing, from an output circuit of the level shifter, an output signal that is logically equivalent to the input signal, the output circuit being in a second voltage domain operating at a second supply voltage, wherein the second supply voltage is different from the first supply voltage;
selecting one of the first or second supply voltages to be provided to the intermediate circuit based on a logical state of the input signal; and
latching the first intermediate signal when the second supply voltage is selected to be provided to the intermediate circuit, wherein the latching is performed by a feedback circuit coupled between the output circuit and the input circuit.

10. The method of claim 9, further comprising providing the first intermediate signal in a logical state equivalent to the logical state of the input signal, and providing the second intermediate signal in a logic state complementary to the intermediate signal.

11. The method of claim 9, further comprising the level shifter, in a quiescent state, consuming zero current.

12. The method of claim 9, further comprising providing, via a feed forward circuit, a complement of the input signal to a first input of a NOR gate in the output circuit and further comprising providing the second intermediate signal to a second input of the NOR gate.

13. An apparatus comprising:
a first functional circuit block in a first voltage domain operating at a first supply voltage;
a second functional circuit block in a second voltage domain operating at a second supply voltage different from the first supply voltage; and
a level shifter circuit configured to transfer signals from the first functional circuit block to the second functional circuit block, wherein the level shifter circuit includes:
an input circuit coupled to receive an input signal from the first functional circuit block and configured to generate a first intermediate signal;
an intermediate circuit coupled to receive the first intermediate signal and configured to generate a second intermediate signal;
an output circuit coupled to receive the second intermediate signal and configured to provide an output signal to the second functional circuit block;
a multiplexer configured to provide one of the first or second supply voltages to the intermediate circuit depending on a logical state of the input signal:
a feedback circuit configured to latch a value of the first intermediate signal when the second supply voltage is provided to the intermediate circuit; and
a feed forward circuit configured to provide a complement of the first input signal from the input circuit to a first input of a NOR gate in the output circuit, wherein the NOR gate includes a second input coupled to receive the second intermediate signal.

14. The apparatus of claim 13, wherein the first intermediate signal and the output signal are logically equivalent to the input signal, and wherein the second intermediate signal is logically complementary to the input signal.

15. The apparatus of claim 13, wherein the multiplexer includes:
a first pull-up circuit configured to, when active, provide the first supply voltage to the intermediate circuit; and
a second pull-up circuit configured to, when active, provide the second supply voltage to the intermediate circuit;
wherein the first and second pull-up circuits are each coupled to receive the first intermediate signal and the output signal.

16. The apparatus of claim 13, wherein the level shifter is configured to consume zero current in a quiescent state.

17. The circuit of claim 1, wherein the feedback circuit includes:
a resistor having a first terminal coupled to an output of the second inverting circuit; and
a transistor having a drain terminal coupled to a second terminal of the resistor and a gate terminal coupled to an output of the third inverting circuit, wherein, when the transistor is active, the feedback circuit is configured to latch the state of the first intermediate signal as a logic low.

18. The circuit of claim 1, further comprising a feed forward circuit including a transistor having a gate terminal coupled to an output of the first inverting circuit and a drain terminal coupled to an input of the fourth inverting circuit, wherein, when the transistor is active, the input of the fourth inverting circuit is pulled low.

19. The circuit of claim 13, wherein the feedback circuit includes:
a resistor having a first terminal coupled to an intermediate node coupled between the input circuit and the intermediate circuit; and
a transistor having a drain terminal coupled to a second terminal of the resistor and a gate terminal coupled to the output circuit, wherein, when the transistor is active, the feedback circuit is configured to latch the state of the first intermediate signal as a logic low.

20. The circuit of claim 13, wherein the feed forward circuit includes a transistor having a drain terminal coupled to an output of the NOR gate and a gate terminal coupled to the input circuit, wherein the feed forward circuit is configured to, when the transistor is active, cause the output of the NOR gate to be pulled low.

* * * * *